(12) United States Patent (10) Patent No.: US 9,171,869 B1
Gao et al. (45) Date of Patent: Oct. 27, 2015

(54) ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yujie Gao, Beijing (CN); Sangjin Park, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/573,732

(22) Filed: Dec. 17, 2014

(30) Foreign Application Priority Data

Jun. 27, 2014 (CN) .......................... 2014 1 0302889

(51) Int. Cl.
| | |
|---|---|
| *H01L 23/58* | (2006.01) |
| *H01L 27/12* | (2006.01) |
| *G02F 1/1368* | (2006.01) |
| *H01L 21/66* | (2006.01) |

(52) U.S. Cl.
CPC ............ *H01L 27/124* (2013.01); *G02F 1/1368* (2013.01); *H01L 22/32* (2013.01); *H01L 22/34* (2013.01)

(58) Field of Classification Search
CPC ....... H01L 27/124; H01L 22/32; H01L 22/34; G02F 2001/136254
USPC .......................................................... 257/48
See application file for complete search history.

(56) References Cited

U.S. PATENT DOCUMENTS 7,843,208 B2 * 11/2010 Kwak ...................... 324/760.02

\* cited by examiner

*Primary Examiner* — Tu-Tu Ho
(74) *Attorney, Agent, or Firm* — Nath, Goldberg & Meyer; Joshua B. Goldberg

(57) ABSTRACT

The present invention provides an array substrate and a display device, to solve the problem of low testing precision due to significant difference between characteristics of TFTs in the detecting region and TFTs in the display region in the prior art. The array substrate comprises a display region and a dummy pixel region provided in the periphery of the display region, wherein, at least one detecting unit is provided in the dummy pixel region, each detecting unit comprises one second pixel unit, one thin film transistor is provided correspondingly to each second pixel unit, and respective electrodes of each thin film transistor provided correspondingly to the second pixel unit are connected to an external test device through test lines, respectively.

14 Claims, 3 Drawing Sheets

ARRAY SUBSTRATE AND DISPLAY DEVICE

FIELD OF THE INVENTION

The present invention relates to the field of display device technology, and particularly relates to an array substrate and a display device.

BACKGROUND OF THE INVENTION

Array process is one of stages in the manufacture of a thin film transistor liquid crystal display (TFT-LCD) device. In the array process, a thin film transistor array circuit needs to be formed on a glass substrate. Since the quality of the array circuit directly decides the quality of a TFT-LCD screen, testing of the array circuit becomes an important process in the manufacture of a TFT-LCD device.

As shown in FIG. 1, an array substrate 100, in early stage of the manufacture, includes: a display region 101, a lead wire region 102 and a peripheral region 103. A plurality of first pixel units for display formed by intersecting gate lines and data lines are provided in the display region 101, and each first pixel unit corresponds to one thin film transistor. The lead wire region 102 is configured to provide electric connections of signals for necessary signal elements in the display region 101, for example, an input wire for data line signal in the display region 101 may be included therein. Since the TFTs in the respective pixel units in the display region 101 are disturbed by other patterns and layers, their performance can hardly be detected, and as a result, a detecting region 104 is further provided in the peripheral region 103 of the substrate. As shown in FIG. 2, a plurality of pixel units formed by intersecting gate lines and data lines are provided in the detecting region 104, and each pixel unit corresponds to one thin film transistor (TFT), which is used for detecting characteristics of TFTs on the substrate. Specifically, the respective electrodes of the TFT for detection are connected to a test device through lead wires, as shown in FIG. 3. After the array substrate and a color filter substrate are fitted to form a display panel, the peripheral region 103 is generally cut off.

In actual manufacturing process, there are some differences between the manufacture of the TFTs in the detecting region and the manufacture of the TFTs in the display region. For example, densities of the TFTs and signal lines thereof in the display region are larger than those in the detecting region, and process environments in which the TFTs are respectively formed in the two regions differ a lot, which results in significant difference in electrical characteristics caused by different processes between the TFTs in the two regions, and therefore, the relevant characteristics of the manufactured TFTs in the display region significantly differ from those of the TFTs in the detecting region. Further, the characteristics of the TFTs in the detecting region 104 are nonuniform, and the test results differ significantly.

Therefore, by detecting the relevant characteristics of the TFTs in the detecting region 104, the relevant characteristics of the TFTs in the display region cannot be reflected accurately, thus reducing accuracy of the detection.

SUMMARY OF THE INVENTION

Embodiments of the present invention provide an array substrate and a display device, to solve the problem of low testing precision due to significant difference between characteristics of TFTs in the detecting region and TFTs in the display region in the prior art.

An embodiment of the present invention provides an array substrate, comprising a display region and a dummy pixel region provided in the periphery of the display region, wherein, at least one detecting unit is provided in the dummy pixel region, each detecting unit comprises one second pixel unit, one thin film transistor is provided correspondingly to each second pixel unit, and respective electrodes of each thin film transistor provided correspondingly to the second pixel unit are connected to an external test device through test lines, respectively.

In the array substrate provided by the embodiment of the present invention, a dummy pixel region provided in the periphery of the display region is included, at least one detecting unit for detection is provided in the dummy pixel region, each detecting unit comprises one second pixel unit, one TFT is provided correspondingly to each second pixel unit, and respective electrodes of each TFT provided correspondingly to the second pixel unit are connected to an external test device through test lines, respectively. Since positions of the TFTs in the dummy pixel region and the display region are very close to each other, and process environment in which the second pixel unit(s) is formed is very similar to process environment in which the first pixel units are formed, the difference in electrical characteristics between the TFT of a second pixel unit and the TFT of a first pixel unit due to different processes is very slight, and thus the TFTs of the second pixel unit and the first pixel unit can be considered approximately to have the same electrical characteristics. As a result, by testing relevant characteristics of the TFT in the detecting unit, the relevant characteristics of the TFT of the first pixel unit in the display region can be reflected more accurately, thus improving accuracy of the detection.

Preferably, a pad for contacting with a detecting probe is provided at an end of each test line away from the TFT connected thereto.

By providing a pad for contacting with the detecting probe at an end of each test line away from the TFT connected thereto, the probe of the test device can detect a signal on each test line, and further obtain a driving signal applied to each electrode of the TFT.

Preferably, the test lines comprise a first test line, a second test line and a third test line, a data line supplying an electrical signal to a source electrode of the TFT is connected to the first test line, a drain electrode of the TFT is directly connected to the second test line, and a gate line supplying an electrical signal to a gate electrode of the TFT is connected to the third test line. Electrical signals applied to the source, drain and gate electrodes of the TFT are detected through the first, second and third test lines, respectively, which facilitates simplifying manufacturing process.

Preferably, each test line and the electrode of the TFT connected thereto are provided in the same layer.

Each test line and the electrode of the TFT connected thereto are provided in the same layer, which facilitates simplifying manufacturing process, saving manufacturing material and improving production efficiency.

Preferably, the test lines of each detecting unit are provided in a side of the dummy pixel region away from the display region.

By providing the test lines of each detecting unit at a side of the dummy pixel region away from the display region, influence of the test lines on the characteristics of the TFT can be reduced and accuracy of the detection can be improved.

Preferably, a density in which the at least one second pixel unit is arranged in the dummy pixel region is smaller than or equal to a density in which the first pixel units are arranged in the display region.

When the density in which the at least one second pixel unit is arranged in the dummy pixel region is smaller than or equal to the density in which the first pixel units are arranged in the display region, process environment in which the second pixel unit(s) is formed is similar to process environment in which the first pixel units are formed, which facilitates reducing difference in characteristics of TFTs due to different process environments, so that detected values of a TFT in the detecting unit can reflect the characteristics of the TFT of a first pixel unit in the display region more accurately.

Preferably, the at least one second pixel unit in the dummy pixel region is arranged in an array.

When the at least one second pixel unit in the dummy pixel region is arranged in an array, the arrangement of the at least one second pixel unit is the same as that of the first pixel units in the display region, which causes the process environments of the TFTs of a second pixel unit and a first pixel unit to be more similar to each other, so that the difference between characteristics of the TFT in the detecting unit and the TFT in the display region is reduced.

An embodiment of the present invention provides a display device, which comprises any one of the above array substrate.

DETAILED DESCRIPTION OF THE EMBODIMENTS

The technical solutions in embodiments of the present invention will be described clearly and thoroughly below in conjunction with the accompanying drawings in the embodiments of the present invention. Obviously, the embodiments described below are only a part but not all of the embodiments of the present invention. All other embodiments obtained, based on the embodiments in the present invention, by those skilled in the art without creative efforts fall in the protection scope of the present invention.

An embodiment of the present invention provides an array substrate, comprising a display region and a dummy pixel region provided in the periphery of the display region, at least one detecting unit is provided in the dummy pixel region, each detecting unit comprises one second pixel unit, one thin film transistor is provided correspondingly to each second pixel unit, and respective electrodes of each thin film transistor provided correspondingly to the second pixel unit are connected to an external test device through test lines, respectively.

Figure 1:
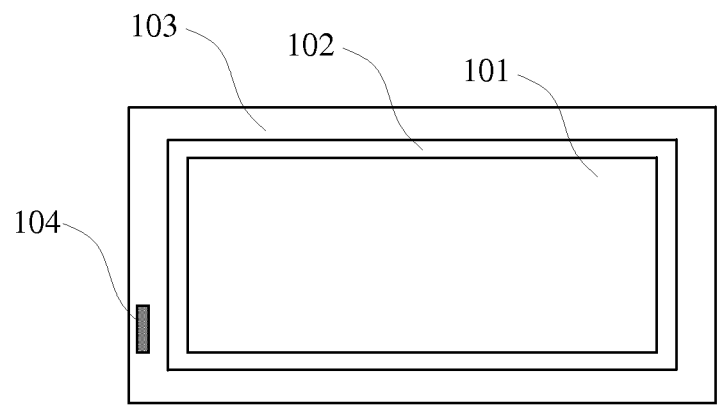
FIG. 1 is a schematic diagram of a planar structure of an array substrate in the prior art.
Figure 2:
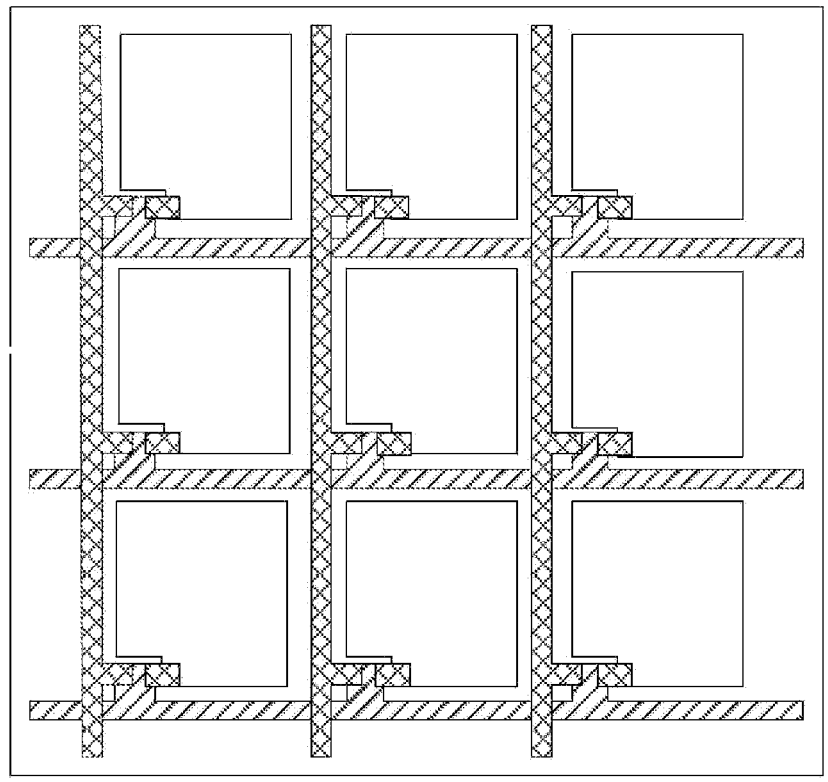
FIG. 2 is a schematic diagram of a planar structure of a detecting region in the array substrate shown in FIG. 1.
Figure 3:
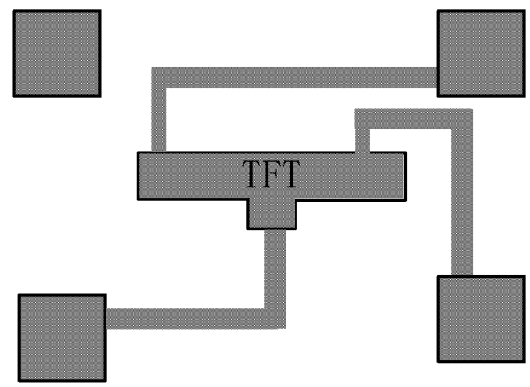
FIG. 3 is a schematic diagram of distribution of lead wires of respective electrodes of a TFT for detection.
Figure 4:
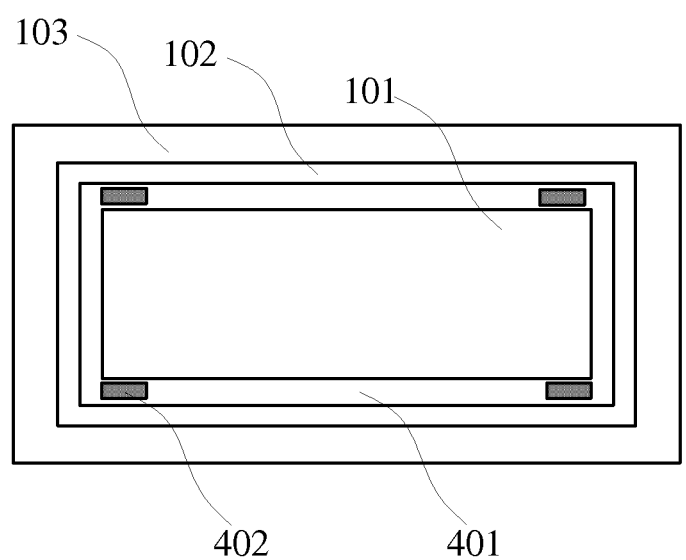
FIG. 4 is a schematic diagram of a planar structure of an array substrate provided by an embodiment of the present invention.

FIG. 4 is a schematic diagram of a planar structure of an array substrate provided by the embodiment of the present invention. As shown in FIG. 4, the array substrate comprises: a display region 101, a dummy pixel region 401 provided in the periphery of the display region 101, a lead wire region 102 provided in the periphery of the dummy pixel region 401 and a peripheral region 103 provided in the periphery of the lead wire region 102.

Figure 5:
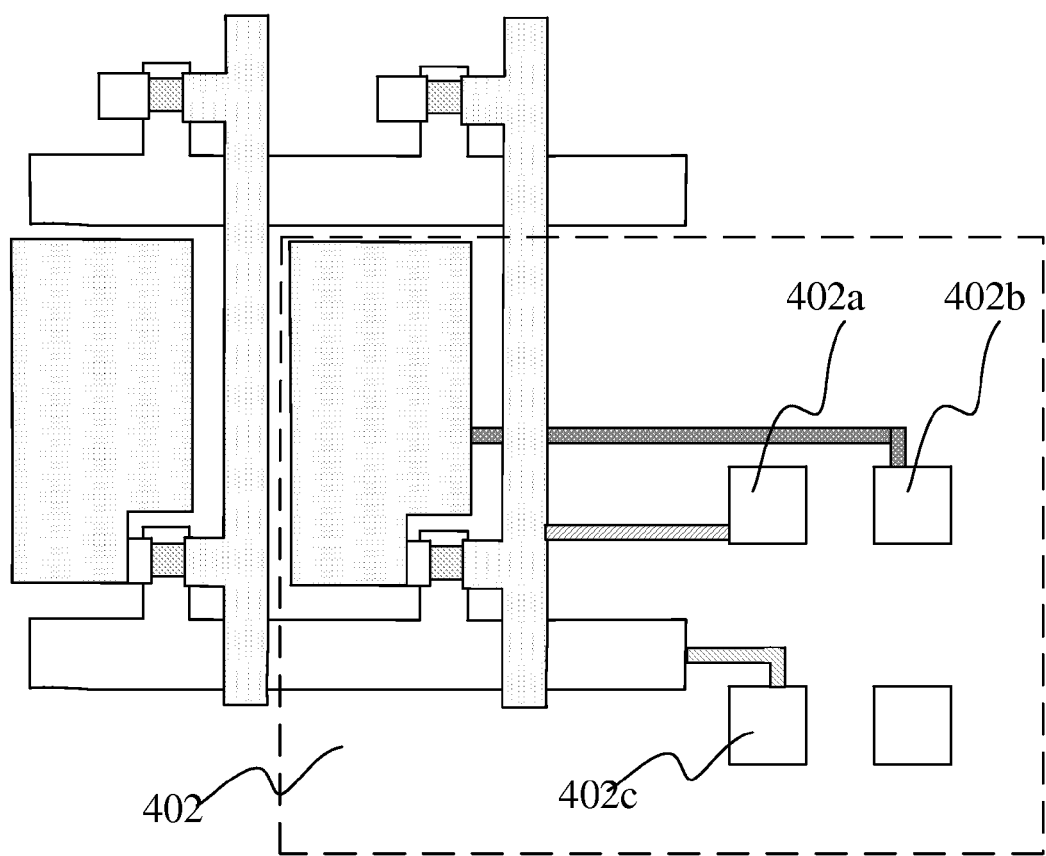
FIG. 5 is a schematic diagram of a structure of a detecting unit in an array substrate provided by an embodiment of the present invention.

Specifically, a plurality of first pixel units for display are provided in the display region 101, and one TFT is provided correspondingly to each first pixel unit. At least one detecting unit 402 is provided in the dummy pixel region 401, each detecting unit 402 comprises one second pixel unit, one TFT is provided correspondingly to each second pixel unit, and moreover, all electrodes of each TFT provided correspondingly to the second pixel unit are connected to an external test device through test lines, respectively, as shown in FIG. 5.

Theoretically, the more detecting units 402 there are in the dummy pixel region 401, and the more uniform the distribution of the detecting units 402 in the dummy pixel region 401 is, the more accurately the measured characteristic values of a TFT reflect the characteristics of a TFT in the display region. However, due to restriction caused by actual process conditions, for example, one detecting unit 402 may be provided adjacent to each corner of the dummy pixel region 401. Of course, the detecting unit(s) 402 can be set according to actual requirement, which is not strictly limited in the present invention. Specifically, both the number and arrangement of the at least one detecting unit 402 are not limited in the present invention. For example, the number of the at least one detecting unit 402 may be one or more, and the second pixel unit(s) in the detecting unit(s) 402 can be arranged in the same manner as the first pixel units in the display region, or be arranged in other manner.

In addition, in the present invention, the size of the dummy pixel region 401 can be set according to actual requirement, which is not specifically limited in the present invention, as long as the process environment of the second pixel unit is similar to that of the first pixel unit.

In an example, a pad (not shown) for contacting with a detecting probe may be provided at an end of each test line away from the TFT connected thereto. The pad may be formed at a position corresponding to an end of the corresponding test line away from the TFT connected thereto in a manner of forming a via hole. A distance between every two adjacent pads may be set according to actual requirement.

By providing a pad for contacting with the detecting probe at an end of each test line away from the TFT connected thereto, the probe of the test device can detect a signal on each test line, and further obtain a driving signal applied to each electrode of the TFT, and thus the problem that a test signal cannot be applied to the array substrate due to restriction in position of probe body in the prior art can be solved.

In an example, the test lines in each detecting unit may be arranged in parallel, and in this manner, signal crosstalk among the test lines can be reduced and test accuracy can be improved.

As shown in FIG. 5, each test line comprises a first test line 402a, a second test line 402b and a third test line 402c. In each detecting unit 402, a data line supplying an electrical signal to a source electrode of the TFT is connected to the first test line 402a, a drain electrode of the TFT is directly connected to the second test line 402b, and a gate line supplying an electrical signal to a gate electrode of the TFT is connected to the third test line 402c. The electrical signals on the source, drain and gate electrodes of the TFT are detected through the first test line 402a, the second test line 402b and the third test line 402c, respectively.

Each test line and the electrode of the TFT connected thereto may be provided in the same layer. Specifically, the first test line 402a and the source electrode of the TFT may be provided in the same layer, the second test line 402b and the drain electrode of the TFT may be provided in the same layer and the third test line 402c and the gate electrode of the TFT may be provided in the same layer.

By providing each test line and the electrode of the TFT connected thereto in the same layer, the process flow can be simplified, manufacturing material can be saved and manufacturing efficiency can be improved. Moreover, an insulation layer is provided between the gate electrode and the source and drain electrodes, and this facilitates reducing signal crosstalk between the third test line and the other two test lines, and improving test accuracy. Of course, the test lines 402a to 402c may not be provided in the same layers as the electrodes of the TFT connected thereto, and at this time, the test lines 402a to 402c may be provided in the same layer.

In an example, the test lines of each detecting unit 402 are provided in a side of the dummy pixel region 401 away from the display region 101. For example, as shown in FIG. 5, when the display region 101 is on the left side of the dummy pixel region 401, the detecting unit 402 is located in the right portion of the dummy pixel region 401, and the test lines 402a to 402c of the detecting unit 402 are located in the right side of the dummy pixel region 401.

By providing the test lines of each detecting unit in a side of the dummy pixel region 401 away from the display region 101, influence of the test lines on the characteristics of the TFT can be reduced and accuracy of the detection can be improved.

As described above, the dummy pixel region 401 and the display region 101 are very close, and therefore, the process environment in which the second pixel unit(s) is manufactured is almost the same as the process environment in which the first pixel units are manufactured. As a result, the density in which the second pixel unit(s) is arranged in the dummy pixel region is no longer a factor that causes inconsistency between the electrical characteristics of the second pixel unit and the first pixel unit. For ease of manufacture and material saving, preferably, the density in which the second pixel unit(s) is arranged in the dummy pixel region may be smaller than or equal to the density in which the first pixel units are arranged in the display region.

Further, when the density in which the second pixel unit(s) is arranged in the dummy pixel region is smaller than or equal to the density in which the first pixel units are arranged in the display region, the process environment in which the second pixel unit(s) is formed can be more similar to the process environment in which the first pixel units are formed, which facilitates reducing difference between characteristics of TFTs caused by different process environments, so that the detected values of a TFT in the detecting unit can reflect the characteristics of the TFT of a first pixel unit in the display region more accurately.

In an example, the second pixel unit(s) in the dummy pixel region 401 may be arranged in an array.

When the second pixel unit(s) in the dummy pixel region 401 is arranged in an array, the manner in which the second pixel unit(s) is arranged may be the same as the manner in which the first pixel units are arranged in the display region 101, which causes the process environment of the TFT of a second pixel unit to be more similar to that of the TFT of a first pixel unit, so that the difference between characteristics of the TFTs in the detecting unit and the display region is reduced.

Embodiments of the present invention further provide a display device, which comprises the above array substrate.

In summary, the embodiments of the present invention provide an array substrate and a display device. The array substrate comprises a dummy pixel region provided in the periphery of the display region, at least one detecting unit for detection is provided in the dummy pixel region, each detecting unit comprises one second pixel unit, to which one TFT is provided correspondingly, and respective electrodes of each TFT provided correspondingly to the second pixel unit are connected to an external test device through test lines, respectively. Since positions of the TFTs in the dummy pixel region and the display region are very close to each other, and process environment in which the second pixel unit(s) is formed is very similar to process environment in which the first pixel units are formed, the difference in electrical characteristics between the TFT of a second pixel unit and the TFT of a first pixel unit due to different processes is very slight, and the TFTs of the second pixel unit and the first pixel unit can be considered approximately to have the same electrical characteristics. As a result, by detecting the relevant characteristics of the TFT in the detecting unit, the relevant characteristics of the TFT of the first pixel unit in the display region can be reflected more accurately, thus improving accuracy of the detection.

Obviously, those skilled in the art can make various modifications and variations to the present invention without departing from the spirit and scope of the present invention. As such, if these modifications and variations of the present invention fall into the scope of the claims of the present invention and equivalents thereof, the present invention intends to cover these modifications and variations.

The invention claimed is:

1. An array substrate, comprising a display region and a dummy pixel region provided in the periphery of the display region, wherein,
   at least one detecting unit is provided in the dummy pixel region, each detecting unit comprises one second pixel unit, one thin film transistor (TFT) is provided correspondingly to each second pixel unit, and respective electrodes of each thin film transistor provided correspondingly to the second pixel unit are connected to an external test device through test lines, respectively.

2. The array substrate of claim 1, wherein, a pad for contacting with a detecting probe is provided at an end of each test line away from the TFT connected thereto.

3. The array substrate of claim 1, wherein, the test lines comprise a first test line, a second test line and a third test line, a data line supplying an electrical signal to a source electrode of the TFT is connected to the first test line, a drain electrode of the TFT is directly connected to the second test line, and a gate line supplying an electrical signal to a gate electrode of the TFT is connected to the third test line.

4. The array substrate of claim 1, wherein, each test line and the electrode of the TFT connected thereto are provided in the same layer.

5. The array substrate of claim 1, wherein, the test lines of each detecting unit are provided at a side of the dummy pixel region away from the display region.

6. The array substrate of claim 1, wherein, a density in which the at least one second pixel unit is arranged in the dummy pixel region is smaller than or equal to a density in which first pixel units are arranged in the display region.

7. The array substrate of claim 1, wherein, the at least one second pixel unit in the dummy pixel region is arranged in an array.

8. A display device, comprising an array substrate, wherein the array substrate comprises a display region and a dummy pixel region provided in the periphery of the display region, wherein,
   at least one detecting unit is provided in the dummy pixel region, each detecting unit comprises one second pixel unit, one thin film transistor (TFT) is provided correspondingly to each second pixel unit, and respective electrodes of each thin film transistor provided correspondingly to the second pixel unit are connected to an external test device through test lines, respectively.

9. The display device of claim 8, wherein, a pad for contacting with a detecting probe is provided at an end of each test line away from the TFT connected thereto.

10. The display device of claim 8, wherein, the test lines comprise a first test line, a second test line and a third test line, a data line supplying an electrical signal to a source electrode of the TFT is connected to the first test line, a drain electrode of the TFT is directly connected to the second test line, and a gate line supplying an electrical signal to a gate electrode of the TFT is connected to the third test line.

11. The display device of claim 8, wherein, each test line and the electrode of the TFT connected thereto are provided in the same layer.

12. The display device of claim 8, wherein, the test lines of each detecting unit are provided at a side of the dummy pixel region away from the display region.

13. The display device of claim 8, wherein, a density in which the at least one second pixel unit is arranged in the dummy pixel region is smaller than or equal to a density in which first pixel units are arranged in the display region.

14. The display device of claim 8, wherein, the at least one second pixel unit in the dummy pixel region is arranged in an array.

* * * * *